(12) United States Patent
Shimomura (10) Patent No.: US 6,352,920 B1
(45) Date of Patent: Mar. 5, 2002

(54) PROCESS OF MANUFACTURING SEMICONDUCTOR DEVICE

(75) Inventor: Narakazu Shimomura, Gojo (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/621,673

(22) Filed: Jul. 24, 2000

(30) Foreign Application Priority Data

Dec. 17, 1999 (JP) ............................................ 11-359344

(51) Int. Cl.[7] .......................................... H01L 21/4763
(52) U.S. Cl. ...................... 438/637; 438/624; 438/629; 438/638; 438/672; 257/774; 257/752
(58) Field of Search ................................. 438/624, 625, 438/629, 637, 638, 672, 675, 634, 622, 687, 620; 257/774, 751, 752, 764

(56) References Cited

U.S. PATENT DOCUMENTS 6,001,730 A * 12/1999 Farkas et al. ............... 438/627
6,143,646 A * 11/2000 Wetzel ........................ 438/637
6,181,012 B1 * 1/2001 Edelstein et al. ........... 257/762

FOREIGN PATENT DOCUMENTS

JP HEI 6(1994)-236875 8/1994

* cited by examiner

*Primary Examiner*—Charles Bowers
*Assistant Examiner*—Hsien-Ming Lee
(74) *Attorney, Agent, or Firm*—Nixon & Vanderhye P.C.

(57) ABSTRACT

A process of manufacturing a semiconductor device comprising: a step of forming an interlayer insulating film so as to cover a plurality of semiconductor elements formed on a semiconductor substrate, a step of forming openings in predetermined regions of the interlayer insulating film on the semiconductor elements in a manner of penetrating only halfway through the interlayer insulating film, a dual damascene step of forming contact hole by removing the interlayer insulating film remaining under the predetermined ones of the openings, thereby forming simultaneously openings for burying a wiring layer which include upper portions of the predetermined openings, a step of forming a conductive layer on the interlayer insulating film to fill at least the contact holes and the openings for burying the wiring layer; and a step of forming contact plugs and a buried wiring layer by removing the conductive layer on the interlayer insulating film.

10 Claims, 6 Drawing Sheets

PROCESS OF MANUFACTURING SEMICONDUCTOR DEVICE

CROSS-REFERENCE TO RELATED APPLICATION

This application is related to Japanese application No. HEI 11 (1999)-359344 filed on Dec. 17, 1999, whose priority is claimed under 35 USC § 119, the disclosure of which is incorporated by reference in its entirety.

BACKGROUND OF THE INVENTION

1. Field of the Invention

The present invention relates to a process of manufacturing a semiconductor device. More particularly, it relates to a process of manufacturing a semiconductor device such as a gate array device, application specified (AS) IC and the like, for which reduction of turn around time (hereinafter referred to as TAT) for the manufacture has been demanded.

2. Description of Related Art

Gate array devices and ASICs are user-specified semiconductor devices obtained by providing a master chip comprising a plurality of transistors formed on a semiconductor substrate and connecting necessary transistors through wirings.

Reduction of TAT has recently been demanded for such semiconductor devices. On the other hand, as users require higher function, the devices are miniaturized by using submicron process and provided with a multi-layered wiring of 3 to 6 layers, which makes TAT lengthy.

Accordingly, methods have been proposed for reducing TAT while dealing with the miniaturization and the multi-layered wiring and retaining highly reliable connection. For example, Japanese Unexamined Patent Publication No. HEI 6(1994)-236875 discloses the following method.

Figure 6A:
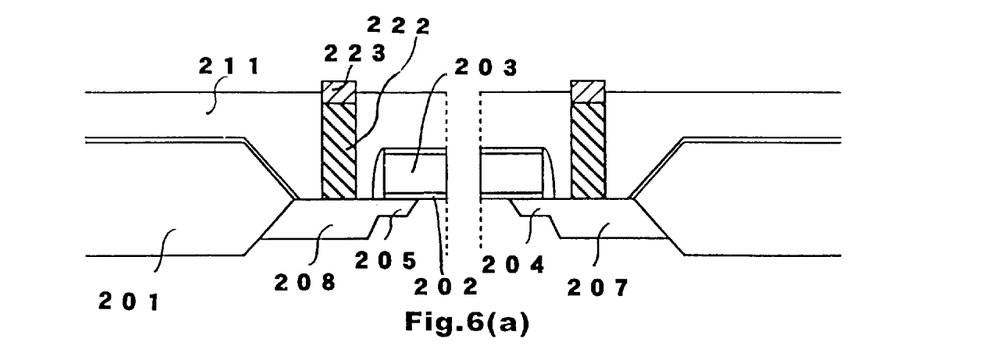
FIGS. 6(a) and 6(b) are schematic sectional views illustrating a process for manufacturing a semiconductor device according to the prior art.
Figure 6B:
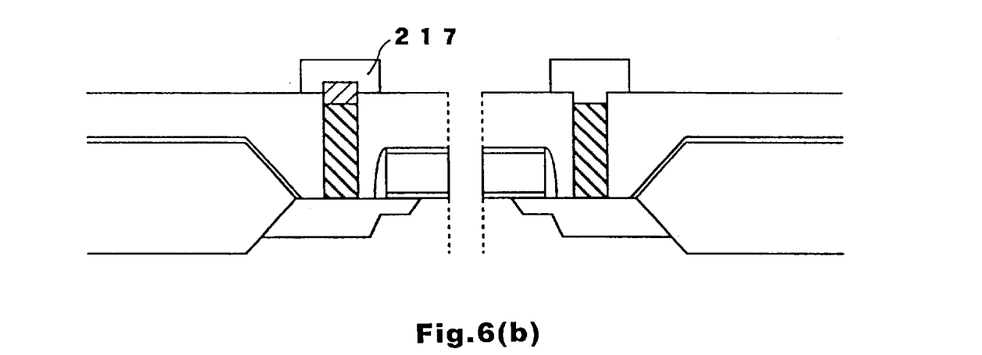

First, a plurality of contact holes are opened in advance and filled with a conductive layer 222 to almost entire depth thereof. Then the remaining openings of the contact holes are filled with an insulating film 223 as shown in FIG. 6(a). Next, after a user's specification is decided, the insulating film 223 in the contact holes desiring to form a wiring layer is removed by photolithography and etching. Then a wiring layer 217 is formed thereon as shown in FIG. 6(b). In the figures, reference numeral 201 is a device isolation region, 202 is a gate insulating film, 203 is a gate electrode, 204 and 205 are low concentration impurity regions, 207 and 208 are high concentration impurity regions, and 211 is an interlayer insulating film.

In this method, the conductive layer is buried in the contact holes. This allows preventing an increase in contact resistance and a decrease in connection reliability that are liable to accompany with the device miniaturization (i.e., an increase in the aspect ratio of the contact holes).

However, this method separately requires the selective removal of the insulating film from the contact holes and the formation of a metal wiring in the removed region after the user's specification is decided. Therefore two photolithography steps and two etching steps must be performed, which makes TAT lengthy.

Further, the metal wiring generates level difference thereon. The level difference complicates the formation of an interlayer insulating film having a flat top surface between the metal wiring and a multi-layered wiring to be formed thereon. This level difference caused by the metal wiring is generally formed in a height of about 0.5 $\mu$m, though it varies depending on the density of current flowing therethrough. It prevents the formation of the multi-layered wiring.

Accordingly, as the semiconductor devices are further miniaturized and the wiring are more multi-layered, there will arise keen demands for:

(a) retaining highly reliable connection by filling the contact holes with the conductive layer;
(b) reducing the level difference caused by the metal wiring as small as possible to improve flatness and to easily form the wiring layer on the metal wiring; and
(c) reducing TAT.

SUMMARY OF THE INVENTION

In consideration of the above subjects, the inventor of the present invention has established a method of manufacturing a semiconductor device capable of burying the conductive layer in the contact holes and reducing the level difference caused by the wiring layer, without taking lengthy TAT. Thus, the present invention has been achieved.

According to the present invention, provided is a process of manufacturing a semiconductor device comprising:

a step of forming an interlayer insulating film so as to cover a plurality of semiconductor elements formed on a semiconductor substrate, a step of forming openings in predetermined regions of the interlayer insulating film on the semiconductor elements in a manner of penetrating only halfway through the interlayer insulating film, a dual damascene step of forming contact hole by removing the interlayer insulating film remaining under the predetermined ones of the openings, thereby forming simultaneously openings for burying a wiring layer which include upper portions of the predetermined openings, a step of forming a conductive layer on the interlayer insulating film to fill at least the contact holes and the openings for burying the wiring layer; and a step of forming contact plugs and a buried wiring layer by removing the conductive layer on the interlayer insulating film.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Hereinafter, the present invention will be explained in detail by way of examples thereof, but the invention is not limited thereto.

EXAMPLE 1

Referring to FIGS. 1(a) to 1(c), 2(a) to 2(c) and 3(a) to 3(c), the present invention will be described. These figures illustrate an example of a semiconductor device in which four transistors are formed as semiconductor elements on one substrate, two transistors on the left are NMOS transistors (referred to as NMOS) and two transistors on the right are PMOS transistors (referred to as PMOS). In the present example, the transistors are used as the semiconductor elements, but resistive elements, capacitance elements and the like may be employed as the semiconductor elements.

Figure 1A:
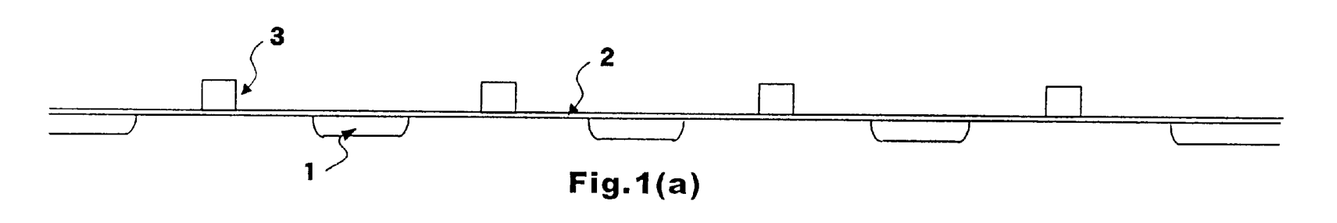
FIGS. 1(a) to 1(c) are schematic sectional views illustrating a process according to a method of manufacturing a semiconductor device of the present invention.

First, as shown in FIG. 1(a), a gate insulating film 2 of about 0.005 to about 0.02 μm thick (e.g., about 0.01 μm) is formed on a semiconductor substrate between device isolation regions made of a $SiO_2$ film 1 of about 0.2 to about 0.6 μm thick (e.g., about 0.4 μm thick) formed in a surface layer of the semiconductor substrate. The gate insulating film 2 may be a silicon oxide film, a silicon nitride film or a laminate of them. A conductive film is deposited on the gate insulating film 2 to a thickness of about 0.1 to about 0.3 μm (e.g., about 0.2 μm) and then subjected to photolithography and etching to form gate electrodes 3. The conductive film for forming the gate electrodes may be a polysilicon film or a polyside film into which impurities are diffused at a high concentration.

Figure 1B:
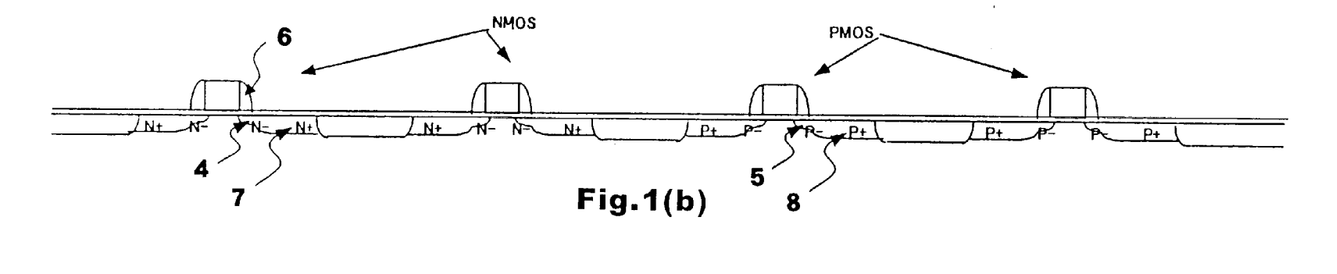

Then, as shown in FIG. 1(b), a predetermined region is covered with a photomask by a photolithography and impurities are injected by ion implantation to the semiconductor substrate through the gate electrodes 3 and the photomask, thereby to form an $N^{31}$ type impurity diffusion layer 4 and a $P^-$ type impurity diffusion layer 5. Then, sidewall spacers 6 of a $SiO_2$ film or a $Si_3N_4$ film are formed on the sidewalls of the gate electrodes 3 by a known technique. After covering a predetermined region again with a photomask by a photolithography, impurities are injected by ion implantation to the semiconductor substrate through the gate electrodes 3, the sidewall spacers 6 and the photomask. Thus, an $N^+$ type impurity diffusion layer 7 and a $P^+$ type impurity diffusion layer 8 are formed. Thereafter, to activate the injected impurities, the substrate structure is preferably annealed at about 700 to about 850° C. for about 30 to about 60 minutes (e.g., at about 800° C. for about 60 minutes). Transistors can be formed through these steps.

Next, an interlayer insulating film is formed to cover the transistors. It is preferred that the top surface of the interlayer insulating film is planarized. The interlayer insulating film may be a film formed by depositing a $SiO_2$ film containing or not containing impurities such as boron or phosphorus by CVD and planarizing it by a reflow process at about 850 to about 900° C. Alternatively, it may be a film formed by depositing the $SiO_2$ film containing or not containing the impurities by CVD and planarizing it by chemical mechanical polishing (CMP). Conditions of the CMP are described below. However, the following conditions are for explanation only, and may be varied as appropriate depending on the kind of interlayer insulating film, polishing cloth and polishing agent.

Polishing cloth pressure: 1 psi
Polishing cloth rotation: 28 rpm
Wafer pressure: 7 psi
Wafer rotation: 32 rpm
Polishing agent: silica-based agent As described later, openings are formed in the interlayer insulating film to penetrate only halfway through it. To form the openings easily, a film of a material different from that of the interlayer insulating film is preferably inserted in the interlayer insulating film. Examples of such a film include a $Si_3N_4$ film, a SiON film and the like.

Figure 1C:
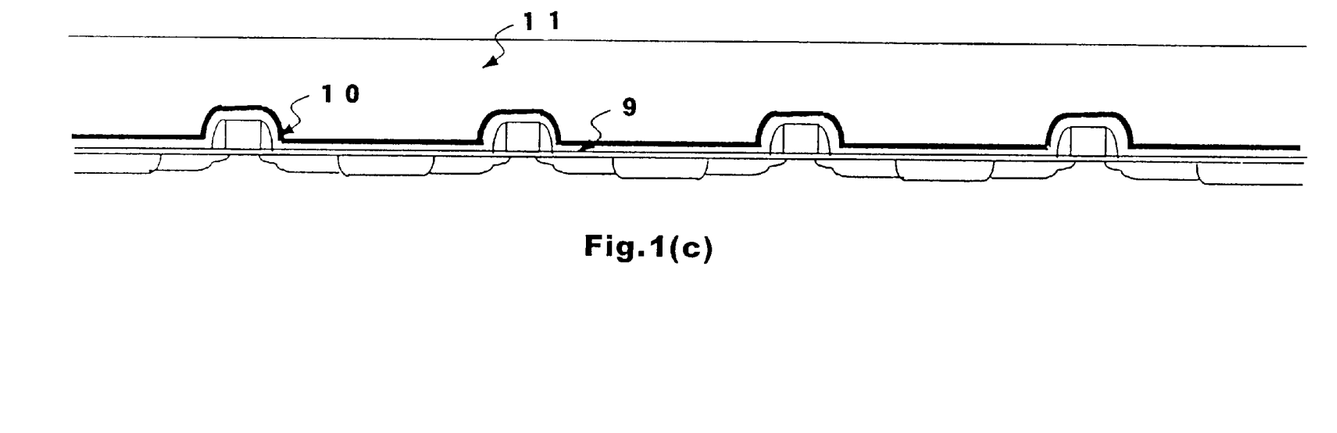

More specifically, as the interlayer insulating film, a $SiO_2$ film 9 of about 0.1 to about 0.2 μm thick, a $Si_3N_4$ film or a SiON film 10 of about 0.01 to about 0.02 μm thick and a $SiO_2$ film 11 of about 0.9 to about 1.1 μm thick are formed in this order on the entire surface of the substrate by CVD as shown in FIG. 1(c).

Figure 2A:
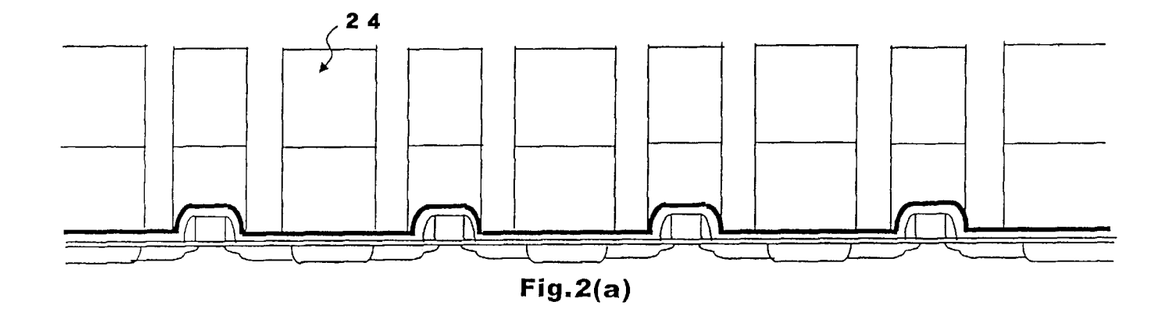
FIGS. 2(a) to 2(c) are schematic sectional views illustrating a process according to the method of manufacturing the semiconductor device of the present invention.

Next, the openings are formed in the interlayer insulating film covering the transistors on the semiconductor substrate to penetrate only halfway through it. The openings are provided above predetermined regions of the semiconductor elements in which electrical conductivity is required. More specifically, the openings are formed in the $SiO_2$ film 11 above the $N^+$ type impurity diffusion layer 7 and the $P^+$ type impurity diffusion layer 8 by photolithography and etching as shown in FIG. 2(a). The $SiO_2$ film 9 and the $Si_3N_4$ film or the SiON film 10 lie under the openings so that the semiconductor substrate is not exposed. That is, the $Si_3N_4$ film or the SiON film 10 serves as an etch stop film.

The openings will be formed into contact holes through the following steps. The openings are not necessarily arranged to meet the requirements of respective users, but may be arranged to include the contact holes that will possibly be connected to meet the requirements of an unspecified number of users. Incidentally, reference numeral 24 in FIG. 2(a) denotes a photomask.

Figure 2B:
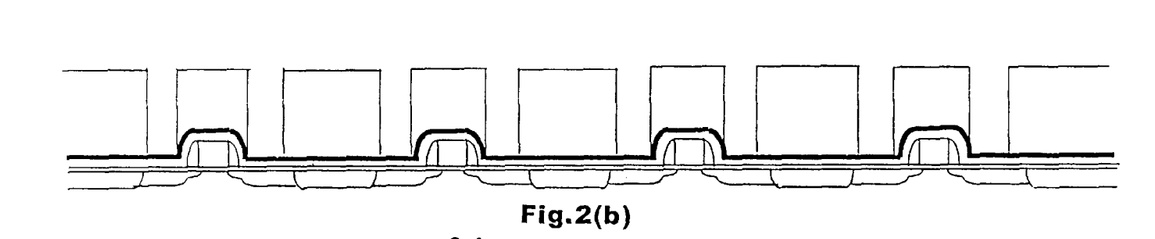

The photomask 24 is removed as shown in FIG. 2(b), thereby to form a master chip provided with the openings for forming the contact holes, on the bottom thereof the semiconductor substrate is not exposed. This master chip can be formed as required by the respective users through the following steps.

The interlayer insulating film remaining under the predetermined openings is removed to form the contact holes, and at the same time, another openings for burying a wiring layer are formed in a surface layer of the interlayer insulating film. This step is generally referred to as a dual damascene step.

Figure 2C:
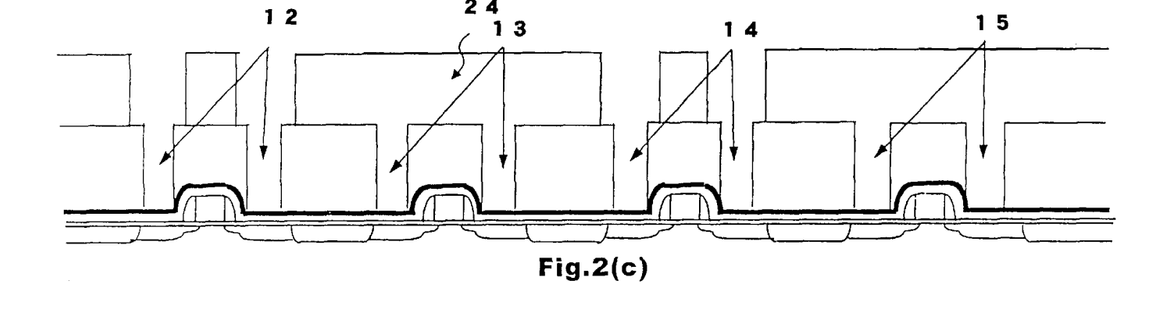

Specifically, as shown in FIG. 2(c), after the user's specification is decided, the photomask 24 having a wiring pattern according to the specification is formed. As required by the user, the photomask 24 opens over the openings 12 and 14 that require connection and covers the openings 13 and 15 where the connection is not required.

Figure 3A:
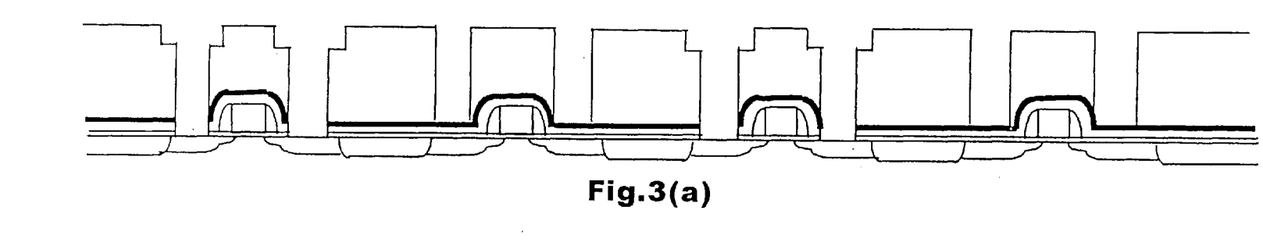
FIGS. 3(a) to (c) are schematic sectional views illustrating a process according to the method of manufacturing the semiconductor device of the present invention.

Thereafter, as shown in FIG. 3(a), the $SiO_2$ film 9 and the $Si_3N_4$ film or the SiON film 10 remaining below the openings are removed using the photomask 24, thereby to form the contact holes. Simultaneously with the formation of the contact holes, the openings for burying the wiring layer are formed on the surface layer of the $SiO_2$ film 1 1 to have a predetermined depth (a depth with which the buried wiring layer can be formed). The predetermined depth varies depending on a desired current density of the wiring layer, but in general, it may be about 0.4 to about 0.8 μm.

The contact holes and the openings for burying the wiring layer are preferably formed by anisotropic etching such as reactive ion etching. More specifically, the reactive ion etching can be performed using an etching gas such as $CF_4$, CHF$_3$, Ar or the like under pressure of about 250 Torr and RF power of about 40 W, for example.

Then, a conductive layer is formed on the interlayer insulating film to fill at least the contact holes and the openings for burying the wiring layer. The conductive layer may be single-layered or multi-layered.

Figure 3B:
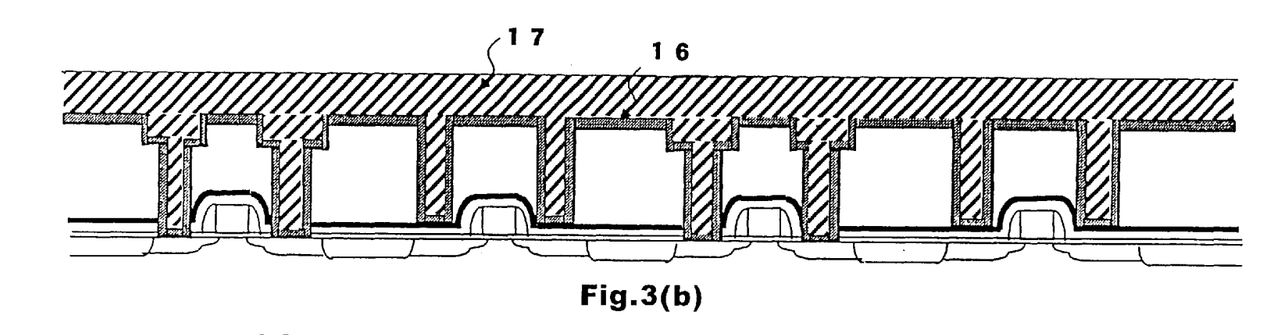

Specifically, as shown in FIG. 3(b), a first conductive layer 16 is formed to a thickness of about 10 to about 50 nm by sputtering and then a second conductive layer 17 is formed to a thickness of about 0.8 to about 1 μm by CVD or plating. The first conductive layer is preferably a bilayer of a thin film of Co, Ti, Ta, W or Pd and a thin film of nitride of Mo, Ta, Ti, W or Zr, or nitrogen oxide. The second conductive layer is preferably made of Cu or an alloy thereof. Examples of the Cu alloy include a Cu alloy with Zr, Cr, Sn or Be. The concentration of the other metal in the Cu alloy is preferably about 0.2 to about 0.6 weight %.

Figure 3C:
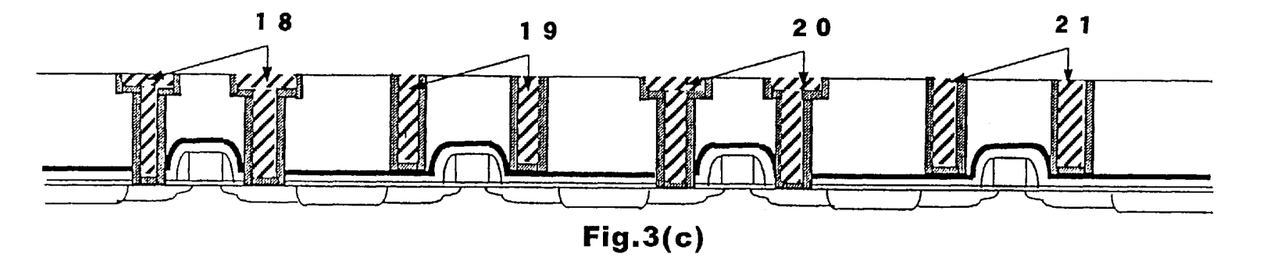

In the next step, the conductive layer on the interlayer insulating film is removed to form contact plugs and a buried wiring layer. More specifically, as shown in FIG. 3(c), the contact plugs and the buried wiring layer are formed by polishing the first and second conductive layers 16 and 17 lying on the SiO$_2$ film 11 at CMP until the surface of the SiO$_2$ film 11 is exposed.

The conditions of CMP are described below. However, the following conditions are for explanation only, and may be varied as appropriate depending on the kinds of interlayer insulating film, polishing cloth and polishing agent.

Polishing cloth pressure: 1 to 1.5 psi

Polishing cloth rotation: 30 to 35 rpm

Wafer pressure: 1 to 1.5 psi

Wafer rotation: 30 to 35 rpm

Polishing agent: NH$_4$OH-based silica

Through the above-mentioned steps, a semiconductor device based on the user's requirements can be manufactured. In the present example, metal wirings 18 and 20 (including the contact plugs and the buried wiring layer) are operative wirings connected with the transistors as required by the user. The metal wirings 19 and 21 are not connected and thus inoperative. The thus obtained semiconductor device is highly reliable because the contact holes are filled with the conductive layer. Further, since the wiring layer is buried in the interlayer insulating film, the top surface of the interlayer insulating film does not generate any substantial level difference. Accordingly, an additional wiring layer can be easily formed on the semiconductor device.

EXAMPLE 2

The present invention will be detailed with reference to FIGS. 4(a), 4(b), 5(a) and 5(b).

The steps mentioned in Example 1 are repeated to the stage shown in FIG. 3(a).

Figure 4A:
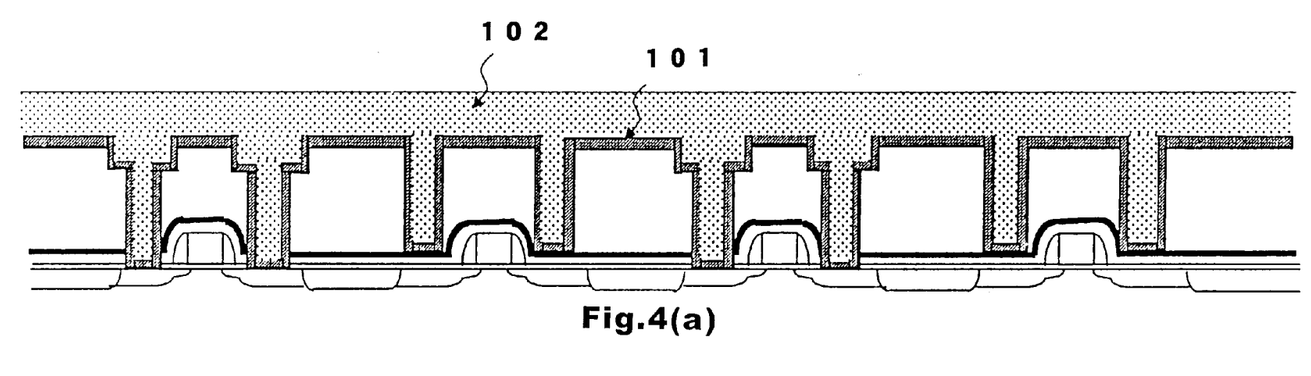
FIGS. 4(a) and 4(b) are schematic sectional views illustrating a process according to the method of manufacturing the semiconductor device of the present invention.

Then, similar to the stage shown in FIG. 3(b), a first conductive layer 101 is formed in about 10 to about 50 nm thick by sputtering and then a second conductive layer 102 is formed in about 0.5 to about 0.6 μm thick by CVD or plating (see FIG. 4(a)). In this example, the second conductive layer is preferably made of W.

Figure 4B:
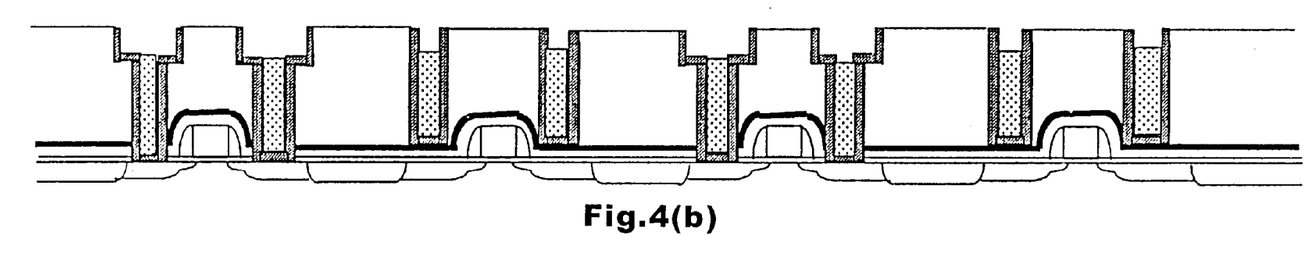

Then, as shown in FIG. 4(b), the second conductive layer 102 is anisotropically etched back, for example, by reactive ion etching. More specifically, the reactive ion etching can be performed using etching gases of SF$_6$ (flow rate: 110 sccm), Ar (90 sccm) and He (10 sccm) under pressure of about 265 mTorr and RF power of about 300 W, for example. This etch back process exposes the first conductive layer 101 lying under the openings for burying the wiring layer and forms contact plugs.

Further, the first conductive layer 101 is anisotropically etched back by, for example, reactive ion etching until the top surface of the SiO$_2$ film 11 is exposed.

This etch back can be performed using an etching gas of CF$_4$, BCl$_3$, Cl$_2$, Ar or the like under pressure of about 2 Pa and RF power of about 40W, for example. However, these conditions are for explanation only, and may be varied as appropriate depending on the kinds of interlayer insulating film, first conductive layer and etching gas.

The above-mentioned etch back process is preferably performed to etch the thickness about 1.5 times as great as that of the first conductive film.

Figure 5A:
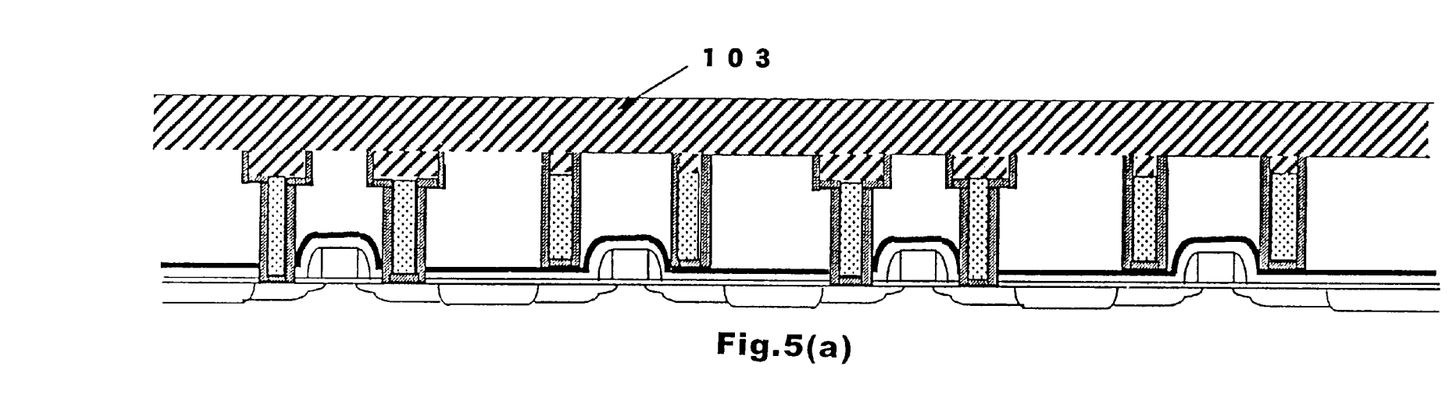
FIGS. 5(a) and 5(b) are schematic sectional views illustrating a process according to the method of manufacturing a semiconductor device according to the present invention.

Next, as shown in FIG. 5(a), a third conductive layer 103 is formed by CVD or sputtering. The third conductive layer may be an Al layer or a laminate of Al/TiN/Ti from the top. When the third conductive layer is the Al layer, the thickness is about 0.6 to about 1.5 μm (e.g., about 1 μm), while it is made of the laminate of Al/TiN/Ti, the thickness is about 0.6-about 1.5 μm /about 5-about 25 nm /about 5-about 25 nm (e.g., about 1 μm /about 15 nm /about 15 nm).

Figure 5B:
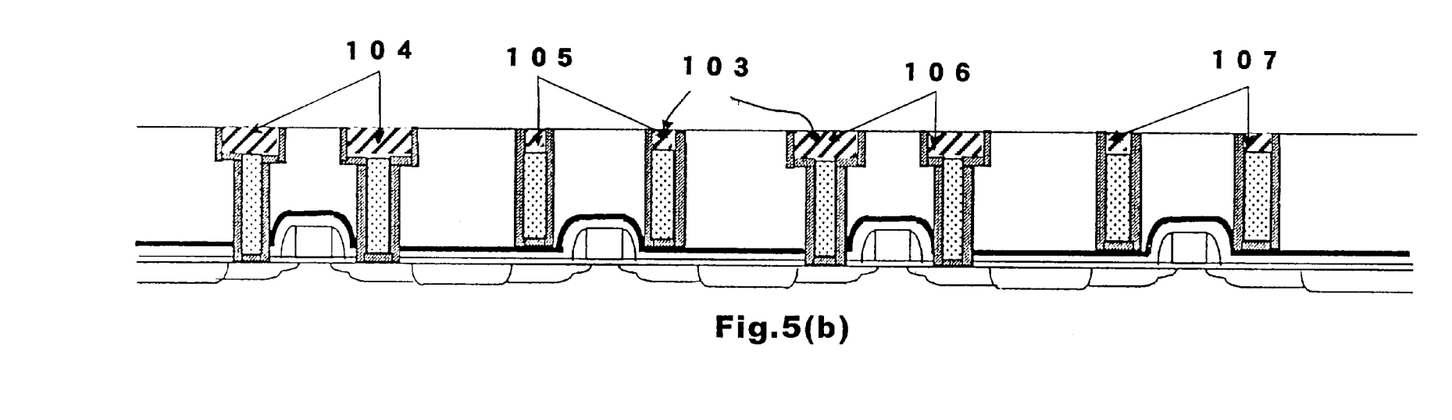

The third conductive layer 103 is anisotropically etched back, for example, by reactive ion etching to form a buried wiring layer (see FIG. 5(b)).

The conditions of the etch back are described below. However, the following conditions are for explanation only, and may be varied as appropriate depending on the kinds of interlayer insulating film, the third conductive layer and etching gas.

A gas mixture of Ar and CH$_4$: 200 sccm

BCl$_3$: 40 sccm

Cl$_2$: 160 sccm

RF power: 40 to 60 W

Pressure: 1 to 2 Pa

Through these steps, a semiconductor device can be manufactured as required by the user. In this example, the metal wirings 104 and 106 are operative wirings connected to the transistors as required by the user, while the metal wirings 105 and 107 are not connected and thus inoperative.

According to the process of the present invention, the wiring layer can be formed by one photolithography and one etching after the user's specification is decided, so that TAT can be shortened. Further, since the conductive layer is buried in the contact holes, highly reliable connection can be ensured. Still further, since the wiring layer is buried in the interlayer insulating film without generating any substantial level difference, a multi-layered wiring can be formed on the wiring layer without suffering from such a level difference.

What is claimed is:

1. A process of manufacturing a semiconductor device, the process comprising:

forming a multi-layer interlayer insulating film so as to cover a plurality of semiconductor elements formed on a semiconductor substrate, forming openings in predetermined regions of the interlayer insulating film on the semiconductor elements in a manner of penetrating only part-way through the interlayer insulating film, placing a mask in and over a first group of the openings and forming contact holes in a second group of the openings while the mask is in the first group of openings by removing the interlayer insulating film remaining under the second group of openings, removing the mask from all of the first group of openings;

forming a conductive layer on the interlayer insulating film to fill at least the contact holes and the first and second groups of openings for burying a wiring layer, so that the wiring layer fills in both the first and second groups of openings but only contacts corresponding doped diffusion regions through the contact holes at bottoms of the second group of openings; and forming contact plugs and a buried wiring layer by removing the conductive layer from on a top surface of the interlayer insulating film.

2. A process according to claim 1, wherein the conductive layer comprises a laminate of a first conductive layer formed on the interlayer insulating film, on walls of the contact holes and on walls of the openings for burying the wiring layer and a second conductive layer formed on the first conductive layer, the first conductive layer being a bilayer of a thin film of Co, Ti, Ta, W or Pd and a thin film of a nitride of Mo, Ta, Ti, W or Zr, or a nitrogen oxide thereof.

3. A process according to claim 1, wherein the conductive layer comprises a laminate of a first conductive layer formed on the interlayer insulating film, on walls of the contact holes and on walls of the openings for burying the wiring layer and a second conductive layer formed on the first conductive layer, the second conductive layer being a layer of Cu or an alloy thereof formed by CVD or plating.

4. A process according to claim 3, wherein the second conductive layer is a layer of a Cu alloy with Zr, Cr, Sn or Be.

5. A process according to claim 1, wherein the conductive layer on the interlayer insulating film is removed by chemical mechanical polishing.

6. A process according to claim 1, wherein the surface comprising the interlayer insulating film and the buried wiring layer is a substantially flat after the removal of the conductive layer on the interlayer insulating film.

7. A process of manufacturing a semiconductor device, the process comprising:

forming an interlayer insulating film so as to cover a plurality of semiconductor elements formed on a semiconductor substrate;

forming openings in predetermined regions of the interlayer insulating film on the semiconductor elements in a manner of penetrating only part-way through the interlayer insulating film;

forming contact holes by removing the interlayer insulating film remaining under predetermined ones of the openings, thereby forming simultaneously openings for burying a wiring layer which include upper portions of the predetermined openings;

forming a conductive layer on the interlayer insulation film to fill at least the contact holes and the openings for burying the wiring layer;

forming contact plugs and a buried wiring layer by removing the conductive layer from a top surface of the interlayer insulating film;

wherein the conductive layer comprises a first conductive layer, a second conductive layer and a third conductive layer, and the contact plugs and the buried wiring layer are formed by:

forming the first conductive layer on the interlayer insulating film, on walls of the contact holes and on walls of the openings for burying the wiring layer;

forming the second conductive layer on the first conductive layer;

removing the second conductive layer from on a top surface of the interlayer insulating film and from at least part of the openings for burying the wiring layer to form the contact plugs;

forming the third conductive layer on the interlayer insulating film to fill at least the openings for burying the wiring layer; and removing the third conductive layer from on the interlayer insulating film to form the buried wiring layer.

8. A process according to claim 7, wherein the second conductive layer is a W layer, and the removal thereof is performed by a dry etch back.

9. A process according to claim 7, wherein the third conductive layer is an Al layer or a laminate of Al/TiN/Ti.

10. A process according to claim 1, wherein the semiconductor device is a gate array device.

* * * * *